US011398415B2

(12) United States Patent
Cheah et al.

(10) Patent No.: US 11,398,415 B2
(45) Date of Patent: Jul. 26, 2022

(54) STACKED THROUGH-SILICON VIAS FOR MULTI-DEVICE PACKAGES

(71) Applicant: Intel Corporation, Santa Clara, CA (US)

(72) Inventors: Bok Eng Cheah, Bukit Gambir (MY); Choong Kooi Chee, Penang (MY); Jackson Chung Peng Kong, Tanjung Tokong (MY); Tat Hin Tan, Penang (MY); Wai Ling Lee, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/451,521

(22) Filed: Jun. 25, 2019

(65) Prior Publication Data

US 2020/0091040 A1 Mar. 19, 2020

(30) Foreign Application Priority Data

Sep. 19, 2018 (MY) .......................... PI 2018703363

(51) Int. Cl.
*H01L 23/48* (2006.01)
*H01L 23/528* (2006.01)
*H01L 23/522* (2006.01)
*H01L 21/768* (2006.01)
*H01L 23/00* (2006.01)

(52) U.S. Cl.
CPC ...... *H01L 23/481* (2013.01); *H01L 21/76898* (2013.01); *H01L 23/528* (2013.01); *H01L 23/5226* (2013.01); *H01L 23/5286* (2013.01); *H01L 24/05* (2013.01); *H01L 24/13* (2013.01); *H01L 24/16* (2013.01); *H01L 2224/0345* (2013.01); *H01L 2224/03462* (2013.01); *H01L 2224/0401* (2013.01); *H01L 2224/05096* (2013.01); *H01L 2224/05573* (2013.01); *H01L 2224/05624* (2013.01); *H01L 2224/05647* (2013.01); *H01L 2224/13025* (2013.01); *H01L 2224/16145* (2013.01); *H01L 2224/16146* (2013.01); *H01L 2224/16225* (2013.01); *H01L 2224/17181* (2013.01)

(58) Field of Classification Search
CPC ........................... H01L 23/481; H01L 23/528
USPC ........................................................ 257/774
See application file for complete search history.

(56) References Cited

U.S. PATENT DOCUMENTS

| 5,037,782 A | * | 8/1991 | Nakamura | ........ H01L 21/76898 438/167 |
| 5,343,071 A | * | 8/1994 | Kazior | .............. H01L 21/76898 257/621 |
| 6,352,923 B1 | * | 3/2002 | Hsuan | ................ H01L 21/76898 438/667 |

(Continued)

*Primary Examiner* — Victoria K. Hall
(74) *Attorney, Agent, or Firm* — Schwegman Lundberg & Woessner, P.A.

(57) ABSTRACT

Disclosed embodiments include a multi-chip package that includes a stacked through-silicon via in a first semiconductive device, and the first semiconductive device is face-to-face coupled to a second semiconductive device by the stacked through-silicon via. The stacked through-silicon via includes a first portion that contacts a second portion, and the first portion emerges from an active semiconductive region of the first semiconductive device adjacent a keep-out region.

18 Claims, 10 Drawing Sheets

(56) References Cited

U.S. PATENT DOCUMENTS

| | | | | |
|---|---|---|---|---|
| 6,365,962 B1* | 4/2002 | Liang | H01L 23/5387 | 257/668 |
| 7,057,274 B2* | 6/2006 | Heschel | G02B 6/4201 | 257/698 |
| 7,871,927 B2* | 1/2011 | Trezza | H01L 21/76898 | 438/667 |
| 7,915,736 B2* | 3/2011 | Kirby | H01L 23/481 | 257/774 |
| 8,202,801 B1* | 6/2012 | Lin | H01L 21/76898 | 438/667 |
| 8,203,207 B2* | 6/2012 | Getz | B81B 7/007 | 257/698 |
| 8,503,186 B2* | 8/2013 | Lin | H01L 24/82 | 361/760 |
| 8,981,533 B2* | 3/2015 | Grivna | H01L 23/481 | 257/621 |
| 9,530,857 B2* | 12/2016 | Roozeboom | H01L 23/49838 | |
| 10,079,199 B2* | 9/2018 | Seddon | H01L 21/67069 | |
| 10,304,792 B1* | 5/2019 | Gu | H01L 23/50 | |
| 10,483,182 B2* | 11/2019 | Oyamada | H01L 23/50 | |
| 10,892,223 B2* | 1/2021 | Schenker | H01L 23/53238 | |
| 10,903,142 B2* | 1/2021 | Cheah | H01L 23/481 | |
| 10,943,792 B2* | 3/2021 | Cheah | H01L 21/48 | |
| 10,950,534 B2* | 3/2021 | Seddon | H01L 27/0207 | |
| 10,991,667 B2* | 4/2021 | Huang | H01L 24/08 | |
| 2003/0209807 A1* | 11/2003 | Hosomi | H01L 23/49827 | 257/774 |
| 2006/0148250 A1* | 7/2006 | Kirby | H01L 25/50 | 438/667 |
| 2006/0223301 A1* | 10/2006 | Vanhaelemeersch | H01L 25/0657 | 438/618 |
| 2007/0032059 A1* | 2/2007 | Hedler | H01L 21/76898 | 438/597 |
| 2008/0203556 A1* | 8/2008 | Huang | H01L 21/76898 | 257/698 |
| 2009/0305502 A1* | 12/2009 | Lee | H01L 23/481 | 438/667 |
| 2010/0072627 A1* | 3/2010 | Wang | H01L 23/4824 | 257/774 |
| 2010/0105169 A1* | 4/2010 | Lee | H01L 24/11 | 438/107 |
| 2010/0252934 A1* | 10/2010 | Law | H01L 21/76877 | 257/774 |
| 2010/0264548 A1* | 10/2010 | Sanders | H01L 23/481 | 257/774 |
| 2011/0042795 A1* | 2/2011 | Knickerbocker | H01L 23/481 | 257/686 |
| 2011/0084385 A1* | 4/2011 | Itaya | H01L 24/06 | 257/737 |
| 2011/0193212 A1* | 8/2011 | Gu | H01L 25/0657 | 257/686 |
| 2011/0254160 A1* | 10/2011 | Tsai | H01L 21/76898 | 257/738 |
| 2011/0254169 A1* | 10/2011 | Lin | H01L 23/481 | 257/774 |
| 2011/0316169 A1* | 12/2011 | Sunohara | H01L 21/76898 | 257/774 |
| 2012/0007154 A1* | 1/2012 | Lin | H01L 21/31111 | 257/288 |
| 2012/0018863 A1* | 1/2012 | Oganesian | H01L 21/76898 | 257/676 |
| 2012/0018868 A1* | 1/2012 | Oganesian | H01L 24/03 | 257/686 |
| 2012/0068327 A1* | 3/2012 | Oganesian | H01L 23/49827 | 257/692 |
| 2012/0068330 A1* | 3/2012 | Oganesian | H01L 24/05 | 257/698 |
| 2012/0193785 A1* | 8/2012 | Lin | H01L 24/97 | 257/737 |
| 2012/0199970 A1* | 8/2012 | Yun | H01L 23/481 | 257/737 |
| 2012/0199984 A1* | 8/2012 | Fujita | H01L 23/481 | 257/774 |
| 2012/0205816 A1* | 8/2012 | Son | H01L 24/05 | 257/774 |
| 2012/0223440 A1* | 9/2012 | Fujita | H01L 23/48 | 257/774 |
| 2012/0256319 A1* | 10/2012 | Mitsuhashi | H01L 27/1469 | 257/774 |
| 2012/0267773 A1* | 10/2012 | Ebefors | H01L 21/6835 | 257/692 |
| 2012/0267786 A1* | 10/2012 | Kirby | H01L 23/5226 | 257/770 |
| 2012/0280366 A1* | 11/2012 | Kamgaing | H01L 23/66 | 257/621 |
| 2012/0280380 A1* | 11/2012 | Kamgaing | H01Q 1/2283 | 257/679 |
| 2013/0009305 A1* | 1/2013 | Oshida | H01L 24/03 | 257/737 |
| 2013/0187275 A1* | 7/2013 | Ohira | H01L 24/13 | 257/758 |
| 2014/0008815 A1* | 1/2014 | Park | H01L 21/76898 | 257/774 |
| 2014/0021628 A1* | 1/2014 | Shih | H01L 27/11548 | 257/774 |
| 2014/0057430 A1* | 2/2014 | Lee | H01L 23/49844 | 438/613 |
| 2015/0371927 A1* | 12/2015 | Batra | H01L 21/76898 | 257/621 |
| 2016/0181201 A1* | 6/2016 | Yang | H01L 23/5386 | 257/737 |
| 2017/0110388 A1* | 4/2017 | Park | H01L 23/53228 | |
| 2017/0177917 A1* | 6/2017 | Pant | G01N 29/0654 | |

* cited by examiner

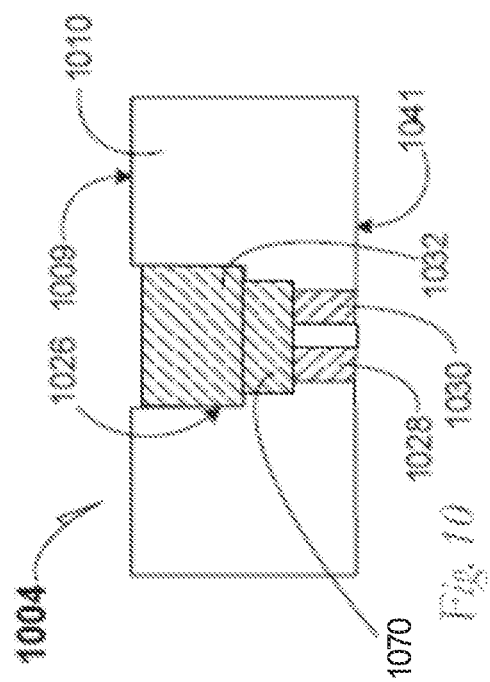

US 11,398,415 B2

STACKED THROUGH-SILICON VIAS FOR MULTI-DEVICE PACKAGES

PRIORITY APPLICATION

This application claims the benefit of priority to Malaysian Application Serial Number PI 2018703363, filed Sep. 19, 2018, which is incorporated herein by reference in its entirety.

FIELD

This disclosure relates to through-silicon via techniques for multiple-device semiconductor apparatus.

BACKGROUND

Semiconductive device miniaturization connected to device packaging, includes challenges to connect sufficient devices in smaller packages.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 10 is a cross-section elevation of a stacked through-silicon via similar to the stricture depicted in FIG. 2C after further processing according to an embodiment.

DETAILED DESCRIPTION

Stacked through-silicon via connected dice are assembled with consolidated keep-out region (KOR) clearances while managing thermomechanical stress differences between the semiconductive material of the dice and the metallic material of the through-silicon vias. Power (Vcc) and ground (Vss) reference voltage networks are interleaved by using stacked through-silicon via techniques to improve power integrity.

Figure 1:
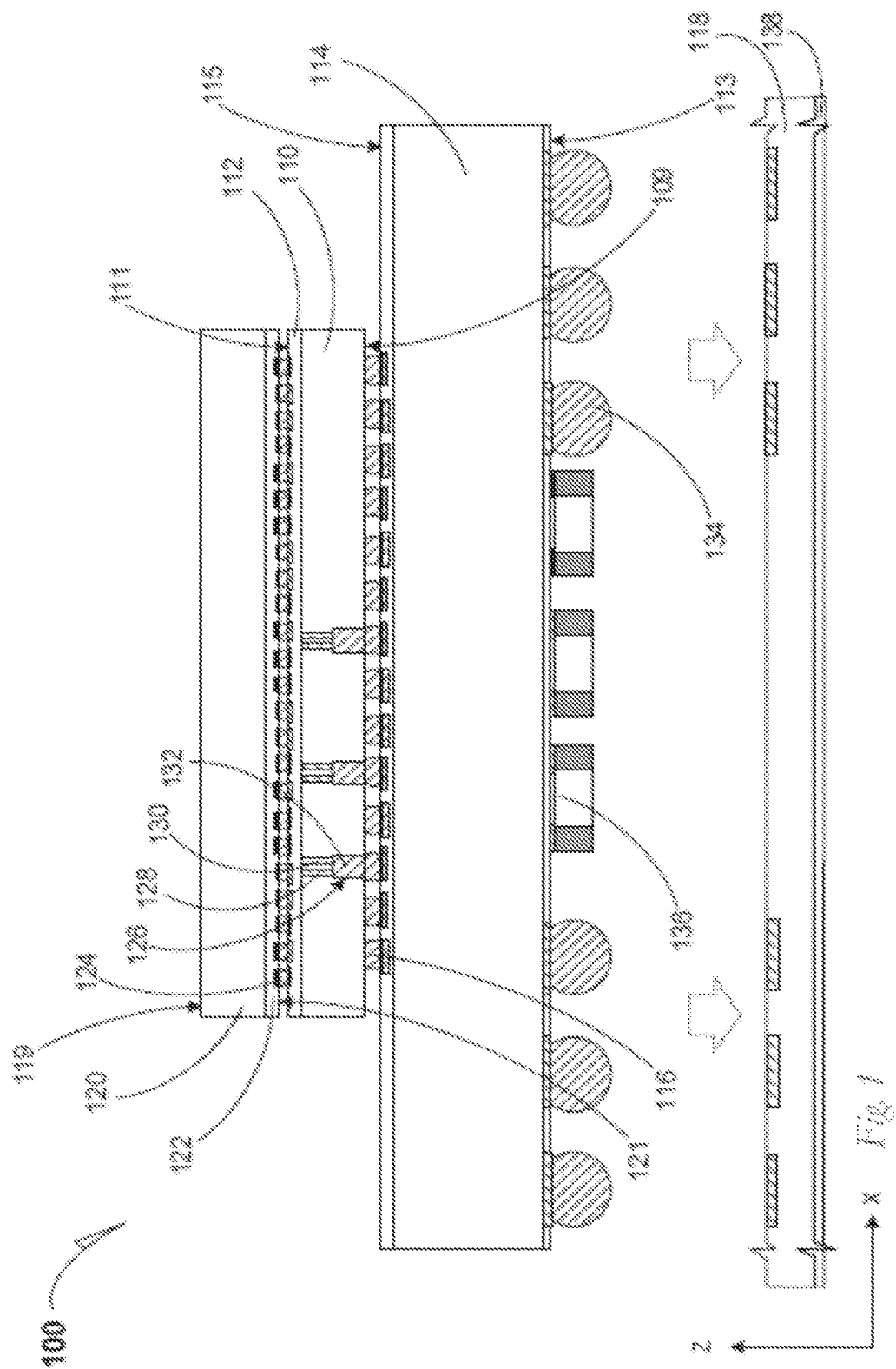
FIG. 1 is a cross-section elevation of a stacked through-silicon via in a stacked semiconductor device package according to an embodiment.

FIG. 1 is a cross-section of a stacked through-silicon via (sTSV) in a stacked semiconductor device package 100 according to an embodiment. A first semiconductive device 110 includes an interconnect surface 111 and a backside surface 109. The interconnect surface 111 is a boundary that includes active semiconductive regions and metallization 112 from the bulk of semiconductive substrate 110. In an embodiment, the first semiconductive device 110 is seated on a semiconductor package substrate 114 that is electrically coupled by use of a series of electrical bumps, one occurrence of which is indicated with reference number 116. In an embodiment, the semiconductor package substrate 114 has a die side 115 and a land side 113. In an embodiment, the semiconductor package substrate is seated on board 118, as indicated by directional arrows pointing the semiconductor package substrate 114 toward the board 118.

In an embodiment, a subsequent semiconductive device 120 includes an interconnect surface 121 and a backside surface 119. The interconnect surface 121 is a boundary that includes active semiconductive regions and metallization 122 separated from the bulk of semiconductive material 120. The first semiconductive device 110 and the subsequent semiconductive device 120 are coupled face-to-face by a ball-grid array of inter-die bumps, one occurrence of which is indicated with reference number 124.

In an embodiment, a stacked through-silicon via 126 includes a plurality of stacked TSV first portions 128 and 130, and a stacked TSV second portion 132. In an embodiment, a single stacked TSV first portion is used with a stacked TSV second portion. In an embodiment, two stacked TSV first portions are used with a stacked. TSV second portion. In an embodiment, three stacked TSV first portions are used with a stacked TSV second portion. In an embodiment, the stacked TSV second portion has a larger footprint in an X-Y lateral plane than any of the stacked TSV first portions.

The semiconductor package substrate 114 includes a ball-grid array, one occurrence of which is indicated with reference number 134, that is configured to couple to the board 118. In an embodiment, at least one passive device 136 is seated on the land side 113 of the semiconductor package substrate 114. The semiconductor package substrate 114 is depicted with internal traces, vias and interlayer dielectrics not illustrated.

In an embodiment, the board 118 includes an external shell 138 that provides at least one of physical and electrical protection for the sTSV in a stacked semiconductor device package 100 such as for tablet, hand-held or remote computing platforms.

FIGS. 2A through 2G are presented in X-Z (width-height) cross section.

Figure 2:
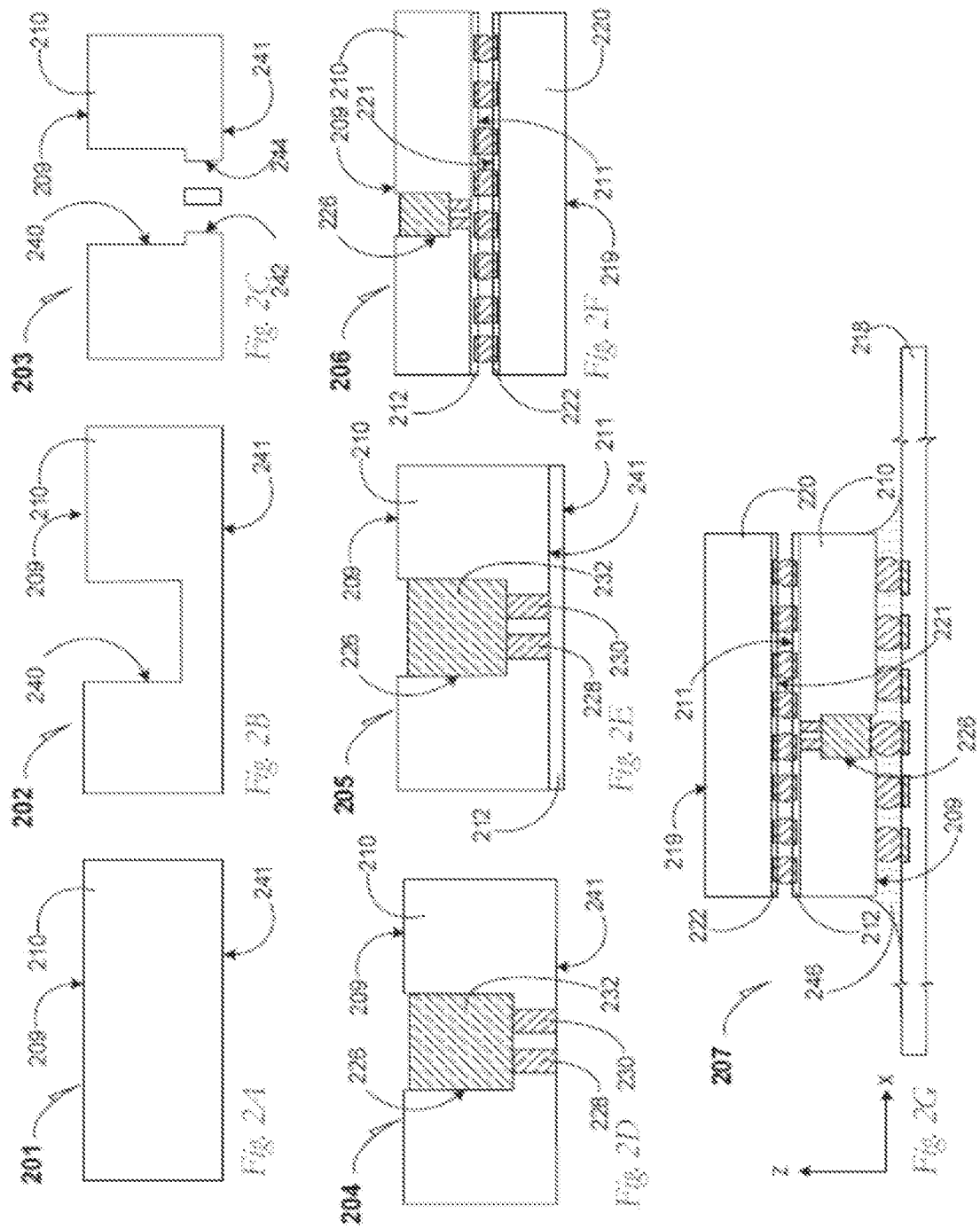
FIG. 2A is a cross-section elevation of a stacked through-silicon via during fabrication according to an embodiment.
FIG. 2B is a cross-section elevation of the stacked through-silicon via depicted in FIG. 2A after further processing according to an embodiment.
FIG. 2C is a cross-section elevation of the stacked through-silicon via depicted in FIG. 2B after further processing according to an embodiment.
FIG. 2D is a cross-section elevation of the stacked through-silicon via depicted in FIG. 2C after further processing according to an embodiment.
FIG. 2E is a cross-section elevation of the stacked through-silicon via depicted in FIG. 2D after further processing according to an embodiment.
FIG. 2F is a cross-section elevation of a stacked multiple-device package that includes a stacked through-silicon via depicted in FIG. 2E after assembling with a subsequent semiconductive device and further processing according to an embodiment.
FIG. 2G is a cross-section elevation of a multiple-device package that includes a stacked through-silicon via, and that is assembled to a semiconductor package substrate according to an embodiment.

FIG. 2A is a cross-section elevation of a stacked through-silicon via 201 during fabrication according to an embodiment. A semiconductive wafer 210 includes a bare-silicon first surface 241 and a backside surface 209. Whether the semiconductive wafer 210 is made from undoped silicon, doped silicon or alternative semiconductive material such as III-V semiconductors, the surface 241 may generically still be generically referred to as a bare-silicon first surface 241. Further, where semiconductive devices and metallization 212 are formed on the bare-silicon first surface 241, it may be referred to as a first surface 241 in connection with the backside surface 209.

FIG. 2B is a cross-section elevation of the stacked through-silicon via 201 depicted in FIG. 2A after further processing according to an embodiment. The stacked through-silicon via 202 has been processed by opening a recess 240 through the backside surface 209. In an embodiment, the recess 240 is made by mechanical drilling. In an embodiment, the recess 240 is made by laser drilling. In an embodiment, the recess 240 is made by directional etching through a mask. In an embodiment, the recess 240 penetrates through the backside surface 209 toward the bare-silicon first surface 241 in a depth range from about 50 percent of the total thickness of the semiconductive wafer 210 to about 95 percent the total thickness of the semiconductive wafer 210.

FIG. 2C is a cross-section elevation of the stacked through-silicon via 202 depicted in FIG. 2B after further processing according to an embodiment. The stacked through-silicon via 203 has been processed by opening at least one recess 242 and 244 in the semiconductive wafer 210 from the bare-silicon first surface 241, and the at least one recess 242 and 244 open and connect to the recess 240. As viewed in X-Z cross section, the width of the recess 240 is greater than the width of the either of the at least one recess 242 and 244.

In an embodiment, the at least one recess 242 and 244 is first formed, followed by the recess 240. In an embodiment, the recess 240 is made by mechanical drilling. In an embodiment, the at least one recess 242 and 244 is made by laser drilling. In an embodiment, the at least one recess 242 and 244 is made by directional etching through a mask. In an embodiment, the at least one recess 242 and 244 penetrates through the bare-silicon first surface 241 toward the backside surface 209 in a depth range from about 5 percent of the total thickness of the semiconductive wafer 210 to about 50 percent the total thickness of the semiconductive wafer 210.

FIG. 2D is a cross-section elevation of the stacked through-silicon via 203 depicted in FIG. 2C after further processing according to an embodiment. The stacked through-silicon via 204 has been processed by forming a stacked through-silicon via 226. The stacked through-silicon via 226 includes a plurality of first stacked TSV portions 228 and 230 that have filled the respective at least one recess 242 and 244 depicted in FIG. 2C. In an embodiment, the plurality of first stacked TSV portions 228 and 230 comprise a conductive metal e.g., copper or aluminum deposited through an electroplating or sputtering process, for example. Further processing includes forming the stacked through-silicon via 226 by filling a second stacked TSV portion 232 into the recess 240 depicted in FIG. 2C. In an embodiment, the second stacked TSV portion 232 comprises a conductive metal e.g., copper or aluminum deposited through an electroplating or sputtering process, for example. In an embodiment, a single stacked TSV first portion is used with a stacked TSV second portion. In an embodiment, two stacked TSV first portions are used with a stacked TSV second portion. In an embodiment, three stacked TSV first portions are used with a stacked TSV second portion. In an embodiment, the stacked TSV second portion 232 has a larger footprint in an X-Y lateral plane than any of the stacked TSV first portions 228 and 230.

FIG. 10 is a cross-section elevation of a stacked through-silicon via 1004 similar to the stricture depicted in FIG. 2C after further processing according to an embodiment. The stacked through-silicon via 1004 has been processed by forming a stacked through-silicon via 1026. The stacked through-silicon via 1026 includes a plurality of first stacked TSV portions 1028 and 1030 that have filled respective at least one recesses such as depicted in FIG. 2C.

In an embodiment, the stacked through-silicon via 1026 includes a stacked TSV third portion 1070 between the stacked TSV first portions 1028, 1030 and the stacked TSV second portion 1032. The stacked TSV third portion 1070 has a footprint in an X-Y lateral plane that is smaller than the footprint of the stacked TSV second portion 1032 and larger than the footprint of the stacked TSV first portions 1028, 1030. In an embodiment, footprint of the stacked TSV third portion 1070 is nearer to the footprint of the stacked TSV second portion 1032 than the footprint of the stacked TSV first portions 1028, 1030.

In an embodiment, processing first achieves the stacked TSV first portions 1028 and 1030 by opening the semiconductive wafer 1010 and filling vias, followed by opening the semiconductive wafer 1010 and filling the stacked TSV third portion 1070. Next, the semiconductive wafer 1010 is opened and the TSV second portion 1032 is filled against the TSV third portion 1070.

FIG. 2E is a cross-section elevation of the stacked through-silicon via 204 depicted in FIG. 2D after further processing according to an embodiment. The stacked through-silicon via 205 has been processed by forming a semiconductive device by forming an interconnect surface 211 on the bare-silicon first surface 241. The interconnect surface 211 is an outer boundary that includes active semiconductive regions and metallization 212. In an embodiment, formation of the active semiconductive regions and metallization within the structure 12, uses the at least one stacked TSV first portions 228 and 230 as fiducials for forming active devices such as transistors. As such, the stacked through-silicon via 226 may also be referred to as a buried silicon via 226.

FIG. 2F is a cross-section elevation of a stacked multiple-device assembly that includes a stacked through-silicon via 205 depicted in FIG. 2E after assembling with a subsequent semiconductive device and further processing according to an embodiment. The stacked through-silicon via 205 depicted in FIG. 2E, has been assembled as a first semiconductive device 210, to a subsequent semiconductive device 220. In an embodiment, the stacked through-silicon via 226 is coupled to the subsequent semiconductive device 220 at active semiconductive regions and metallization 222. The active semiconductive regions and metallization 222 are arrayed on a surface 221 opposite a backside surface 219.

FIG. 2G is a cross-section elevation of a multiple-device package 207 that includes a stacked through-silicon via 226, and that is assembled to a semiconductor package substrate 218 according to an embodiment. An underfill material 246 is located between the first semiconductive die 210 backside surface 209 and the semiconductor package substrate 218.

Figure 3:
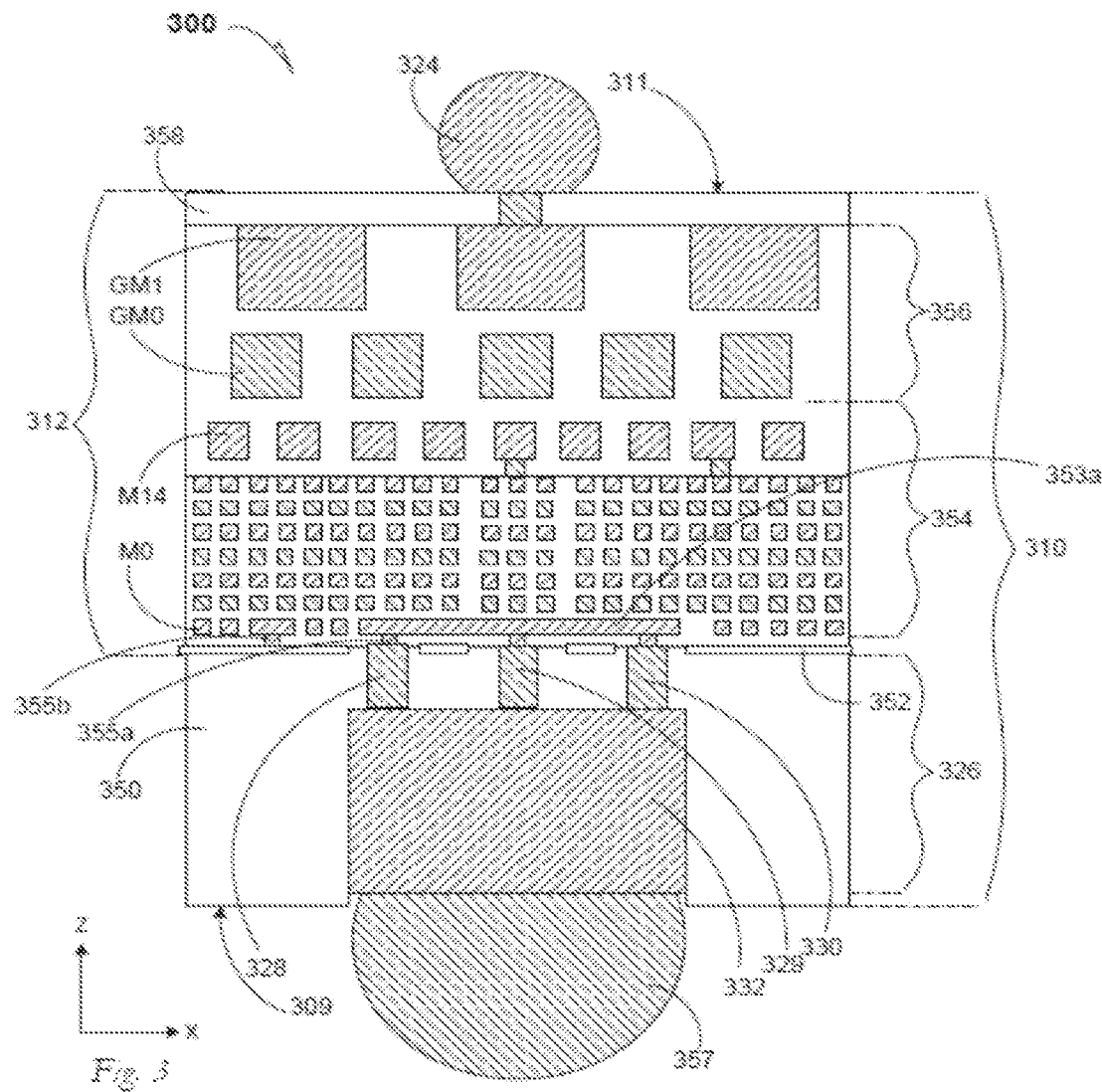
FIG. 3 is a cross-section elevation and detail extraction of a stacked through-silicon via as it couples to active areas, metallization and giant metallization for a semiconductive device according to an embodiment.

FIG. 3 is a cross-section elevation and detail extraction of a stacked through-silicon via 300 as it couples to active areas, metallization and giant metallization for a semiconductive device according to an embodiment.

A stacked through-silicon via 326 includes a plurality of stacked TSV first portions 328, 329 and 330, and a stacked TSV second portion 332. In and embodiment, a first semiconductive device 310 is similar to the first semiconductive device 110, or to the first semiconductive device 210 depicted respectively in FIGS. 1 and 2G.

Details within the first semiconductive device 310 include active semiconductive regions and metallization 312 between a backside surface 309 and an interconnect surface 311. The active semiconductive devices are formed at the analogous surface to the bare-silicon first surface 241 depicted in FIG. 2D, followed by metallization techniques that finish to form the interconnect surface 311.

Further detail of the active semiconductive devices include bulk semiconductive material 350, an active semiconductive-device layer 352, a first metallization zone 354, including metal-zero (M0) to, e.g. M14 layer 354, and a giant metallization zone 356, including giant metal-zero (GM0) to GM1.

Where the several stacked through-silicon via first portions 328, 329 and 330 penetrate to the metallizations 354, keep-out regions are devoid of the active semiconductive-device layer that abuts the bulk semiconductive material 350. The keep-out regions may be a gap between a given stacked through-silicon via first portion, e.g. item 328 and the active semiconductive-device layer 352, where the keep-out region is derived from the bare-silicon first surface (see item 241 in FIG. 2D). Where the bulk semiconductive material 350 is appropriately doped, or undoped to prevent significant semiconductive activity, the keep-out region may be the bare-silicon first surface that abuts the stacked through-silicon via first portion, but that does not carry the active semiconductive device layer 352.

In an embodiment, all stacked TSV first portions 328, 329 and 330 and the stacked TSV second portion 332 are part of a power (Vcc) stacked TSV 326. In an embodiment, all stacked TSV first portions 328, 329 and 330 and the stacked TSV second portion 332 are part of a ground (Vss) stacked TSV. In an embodiment, all stacked TSV first portions 328, 329 and 330 and the stacked TSV second portion 332 are part of a signal stacked TSV. In an embodiment, all stacked TSV first portions 328, 329 and 330 are coupled to a first integrated contact pad 353a through conductive vias 355a. In an embodiment, the active semiconductive device layer 352 is coupled to the stacked TSV 326 through conductive vias 355b, at least one metal layer within the first metallization zone 354 and the first integrated contact pad 353a. Electrical coupling between the backside surface 309 and the interconnect surface 311 is done by a landside bump 357 and an inter-die bump 324, where the inter-die bump 324 emerges from the interconnect surface 311 through an interconnect dielectric layer 358.

In an embodiment, a portion of the active semiconductive device layer 352 resides adjacent the plurality of the stacked TSV first portions 328, 329 and 330 within the footprint of the stacked TSV second portion 332. Reduced KOR between the active semiconductive device layer 352 and the miniaturized stacked TSV first portions enhances overall transistor device density.

Figure 3A:
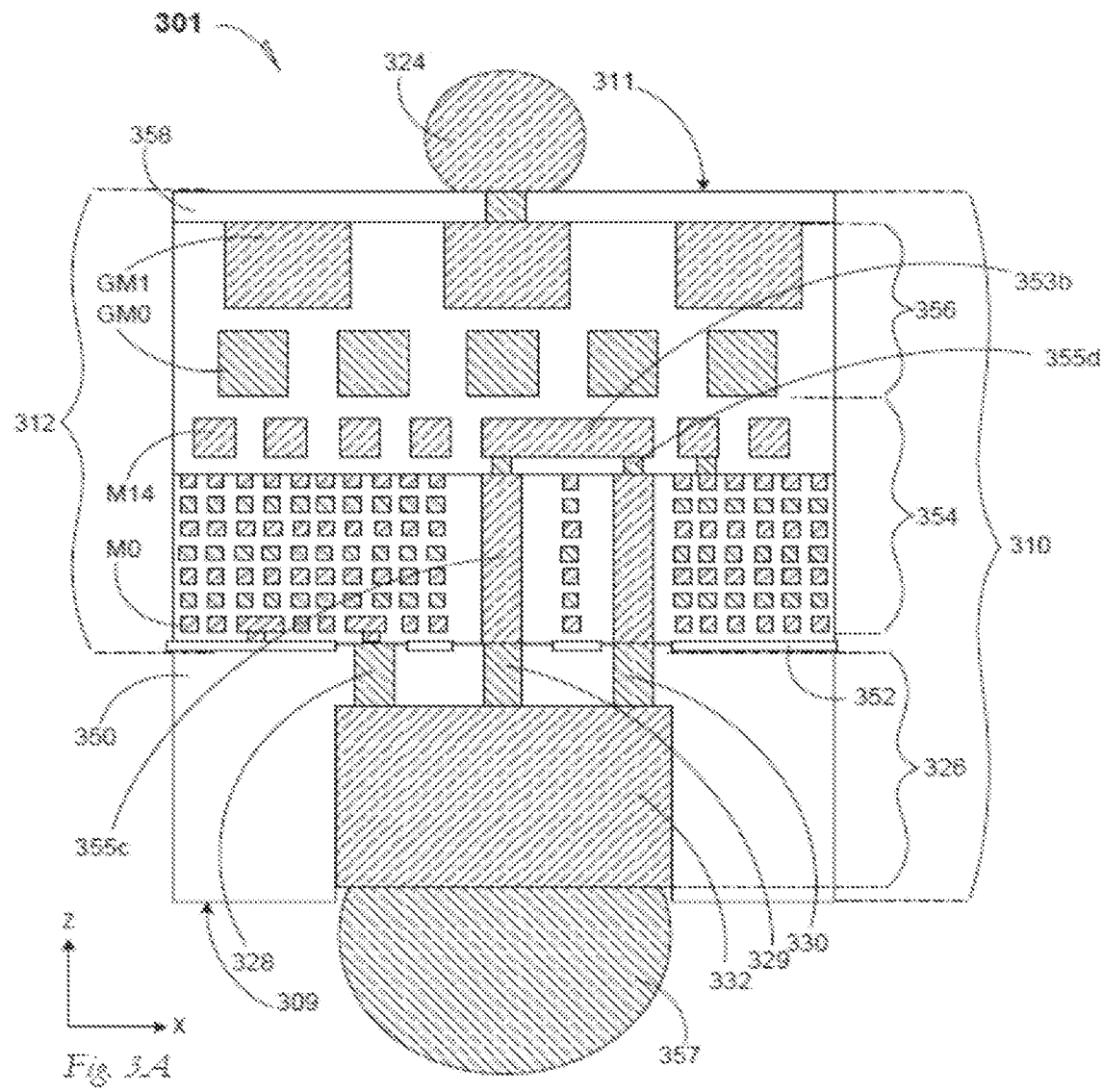
FIG. 3A is a cross-section elevation and detail extraction of a stacked through-silicon via as it couples to active areas, metallization and giant metallization for a semiconductive device according to an embodiment.

FIG. 3A is a cross-section elevation and detail extraction of a stacked through-silicon via 301 as it couples to active areas, metallization and giant metallization for a semiconductive device according to an embodiment. Structures similar to the stacked through-silicon via 300 depicted in FIG. 3, with a structural difference of one or more dedicated small-metallization via 355c within the region of the first metallization zone 354. In an embodiment, penetration of the dedicated small-metallization via 355c begins as small metallization zero (M0) and extends at least to small-metallization Mn−1, which as illustrated is to the depth of M13 where M14 is Mn. In an embodiment, two or more dedicated small-metallization vias 355c are coupled to a second integrated contact pad 353b resides within the region of the first metallization zone 354 through conductive vias 355d.

In an example embodiment, the stacked through-silicon via 301 is part of a first semiconductive device similarly configured as the first semiconductive device 110 depicted in FIG. 1 and where power is delivered through the stacked TSV second portion 332, the stacked TSV first portions 329 and 330, to a subsequent semiconductive device that is similarly configured as the subsequent semiconductive device 120, also depicted in FIG. 1.

In an embodiment, the stacked through-silicon via 301 is part of a first semiconductive device similarly configured as the first semiconductive device 110 depicted in FIG. 1 and where ground (Vss) is received through the stacked TSV second portion 332, the stacked TSV first portions 329 and 330, to a subsequent semiconductive device that is similarly configured as the subsequent semiconductive device 120, also depicted in FIG. 1.

In an embodiment, the stacked through-silicon via 301 is part of a first semiconductive device similarly configured as the first semiconductive device 110 depicted in FIG. 1 and where a signal is delivered or is received through the stacked TSV second portion 332, the stacked TSV first portions 329 and 330, to a subsequent semiconductive device that is similarly configured as the subsequent semiconductive device 120, also depicted in FIG. 1.

Figure 4:
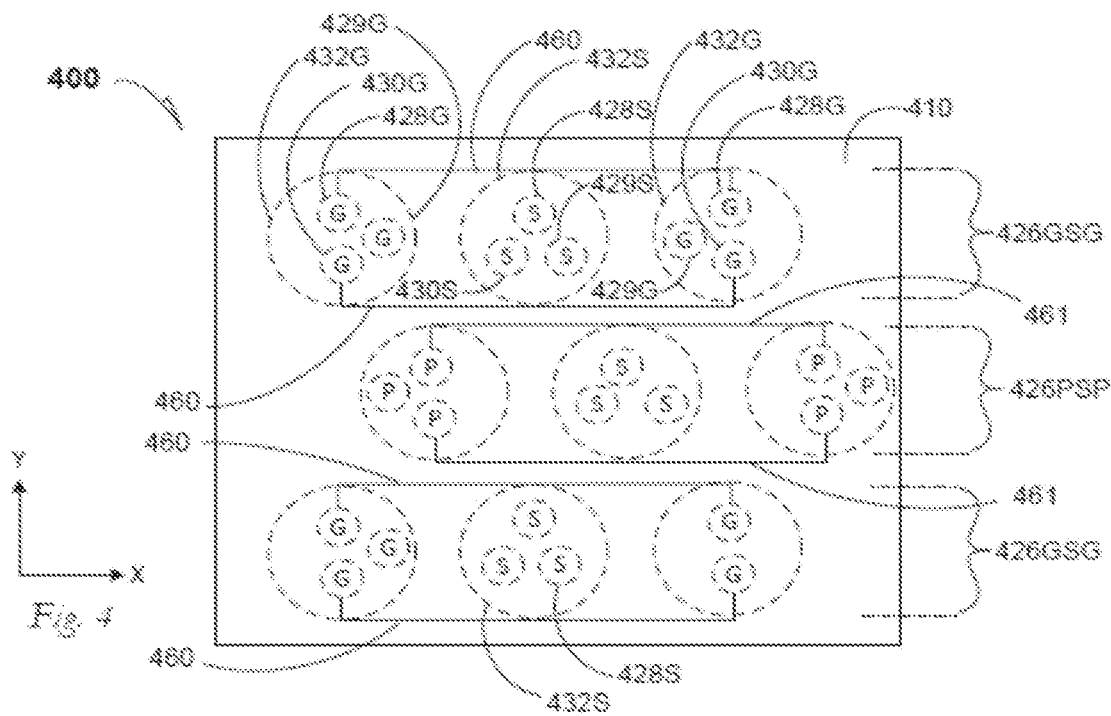
FIG. 4 is a schematic plan that includes several stacked through-silicon vias, including power, ground and signal sTSVs that are interleaved and clustered according to several embodiments.

FIG. 4 is a schematic plan 400 that includes several stacked through-silicon vias, including power, ground and signal sTSVs that are interleaved and clustered according to several embodiments. In an embodiment, a first semiconductive device 410 includes several sTSVs.

For example, a row of stacked through-silicon vias 426GSG includes two ground sTSVs that straddle a signal sTSV. With attention directed to the row of stacked through silicon vias 426GSG, the larger dashed circles represent approximate footprints for individual sTSVs that include the approximate characteristic dimension for the sTSV second portion (e.g. item 332 in FIG. 3). Within the larger dashed circles, the letter G in smaller dashed circles represent the sTSV first portions of a ground sTSV. Similarly for the signal sTSV, the larger dashed circle represents the approximate footprint for an individual signal sTSV where the larger circle includes the approximate characteristic dimension for the sTSV second portion 432S, and the smaller dashed circles with a letter S represent the sTSV first portions such as 428S, 429S and 430S of a signal sTSV.

Interleaving between, two ground sTSVs are coupled by silicon metal routing such as between individual M0 (see, e.g., FIG. 3) metallizations, where at least one ground (Vss) metal routing 460 couples two ground sTSVs across a signal sTSV. The routing 460 is also referred to as ground (Vss) silicon metal routing 460 such as within small metallization.

The central row of stacked through-silicon vias 426PSP is similarly situated as the top row of stacked through-silicon vias 426GSG, where power sTSVs take the place of ground sTSV. Two power sTSVs are coupled by silicon metal routing such as between individual M0 (see, e.g., FIG. 3) metallizations, where at least one power (Vcc) metal routing 461 couples two power sTSVs across a signal sTSV. The routing 461 is also referred to as power (Vcc) silicon metal routing 461 such as within small metallization. The bottom row of stacked through-silicon vias 426GSG is similarly situated as the top row of stacked through-silicon vias 426GSG, where three signal stacked through-silicon first portions 428S (one enumerated) are located within the footprint created by the signal stacked through-silicon second portion 432S.

In an embodiment, the ground (Vss) silicon metal routing 460 and the power (Vcc) silicon metal routing 461 are interleaved to improve power integrity. In an embodiment, the ground (Vss) silicon metal routing 460 and the power (Vcc) silicon metal routing 461 reside within the first metallization zone (e.g. item 354 in FIG. 3) such as M14, in an embodiment, the ground (Vss) silicon metal routing 460 and the power (Vcc) silicon metal routing 461 reside within the giant metallization zone (e.g. item 356 in FIG. 3) such as giant metal-zero (GM0). In an embodiment, the Vss metal routing 460 and the Vcc metal routing 461 extend across the first metallization zone (e.g. item 354 in FIG. 3) and the giant metallization zone (e.g. item 356 in FIG. 3) in the form of metal layer stack.

Figure 5:
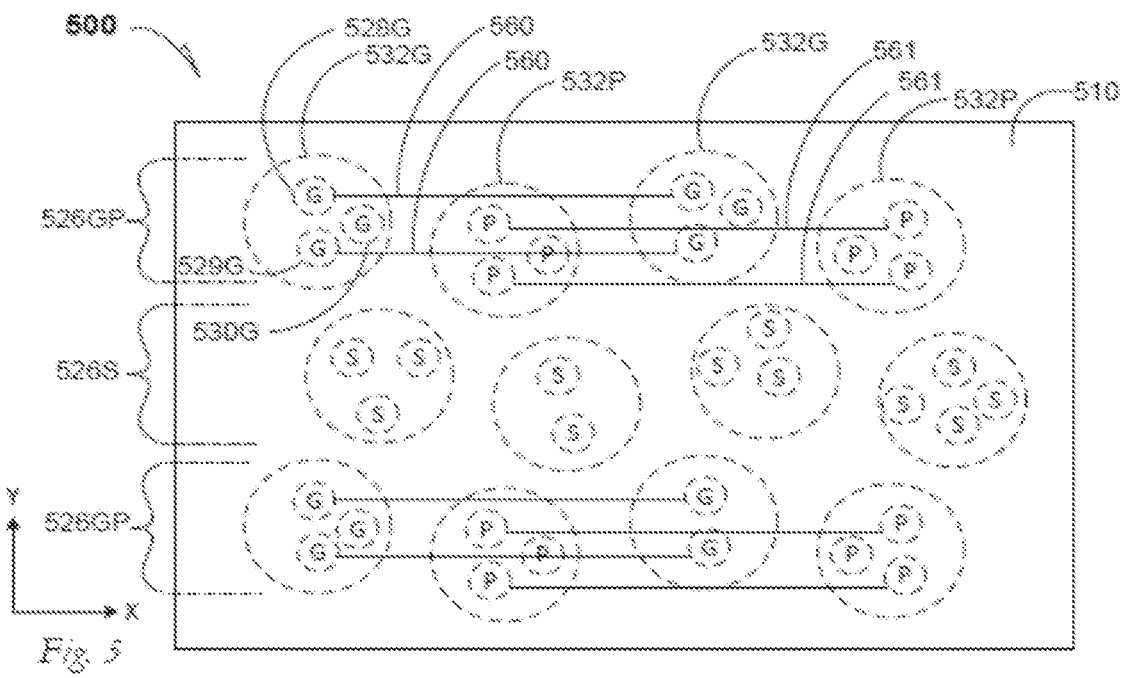
FIG. 5 is a schematic plan that includes several stacked through-silicon vias, including power, ground and signal sTSVs, where adjacent power and ground sTSVs are interleaved and clustered according to several embodiments.

FIG. 5 is a schematic plan 500 that includes several stacked through-silicon vias, including power, ground and signal sTSVs, where adjacent power and ground sTSVs are interleaved and clustered according to several embodiments. In an embodiment, a first semiconductive device 510 includes several sTSVs.

For example, a row of signal stacked through-silicon vias 526S is straddled by two interleaved power-ground rows 526GP of repeated respective ground- and power stacked through-silicon vias. With attention directed to the top power-ground row, 526GP, the larger dashed circles represent approximate footprints for individual ground sTSVs that include the approximate characteristic dimension for the sTSV second portion 532G. Within the larger dashed circles, the letter G in smaller dashed circles represent the sTSV first portions e.g., 528G, 529G and 530G of a ground sTSV. Similarly, for power sTSVs, the larger dashed circles represent approximate footprints for individual power sTSVs that include the approximate characteristic dimension for the sTSV second portion 532P, and the smaller dashed circles with a letter P represent the first sTSV portions of power sTSVs.

Interleaving between, two ground sTSVs are coupled by metal routing such as between individual M0 (see, e.g., FIG. 3) metallizations, where at least one ground (Vss) electrical routing 560 couples two ground sTSVs across a power sTSV. Similarly, interleaving between two power sTSVs are coupled by metal routing such as between individual M0 metallizations, where at least one power (Vcc) electrical routing 561 couples two power sTSVs 526P across a ground sTSV 526G. Where power and ground sTSVs 526G and 526P are interleaved and interconnected with respective ground (Vss) metal routing 560 and power (Vcc) metal routing 561, loop inductance and power supply induced noise issues are reduced during power delivery.

In an embodiment, the ground (Vss) silicon metal routing 560 and the power (Vcc) silicon metal routing 561 reside within the first metallization zone (e.g. item 354 in FIG. 3) such as M14. In an embodiment, the ground (Vss) silicon metal routing 560 and the power (Vcc) silicon metal routing 561 reside within the giant metallization zone (e.g. item 356 in FIG. 3) such as giant metal-zero (GM0). In an embodiment, the Vss metal routing 560 and the Vcc metal routing 561 extend across the first metallization zone (e.g. item 354 in FIG. 3) and the giant metallization zone (e.g. item 356 in FIG. 3) in the form of metal layer stack.

As illustrated, two interleaved power and ground sTSVs 526GP, straddle a dedicated series of signal sTSVs 526S.

Figure 6:
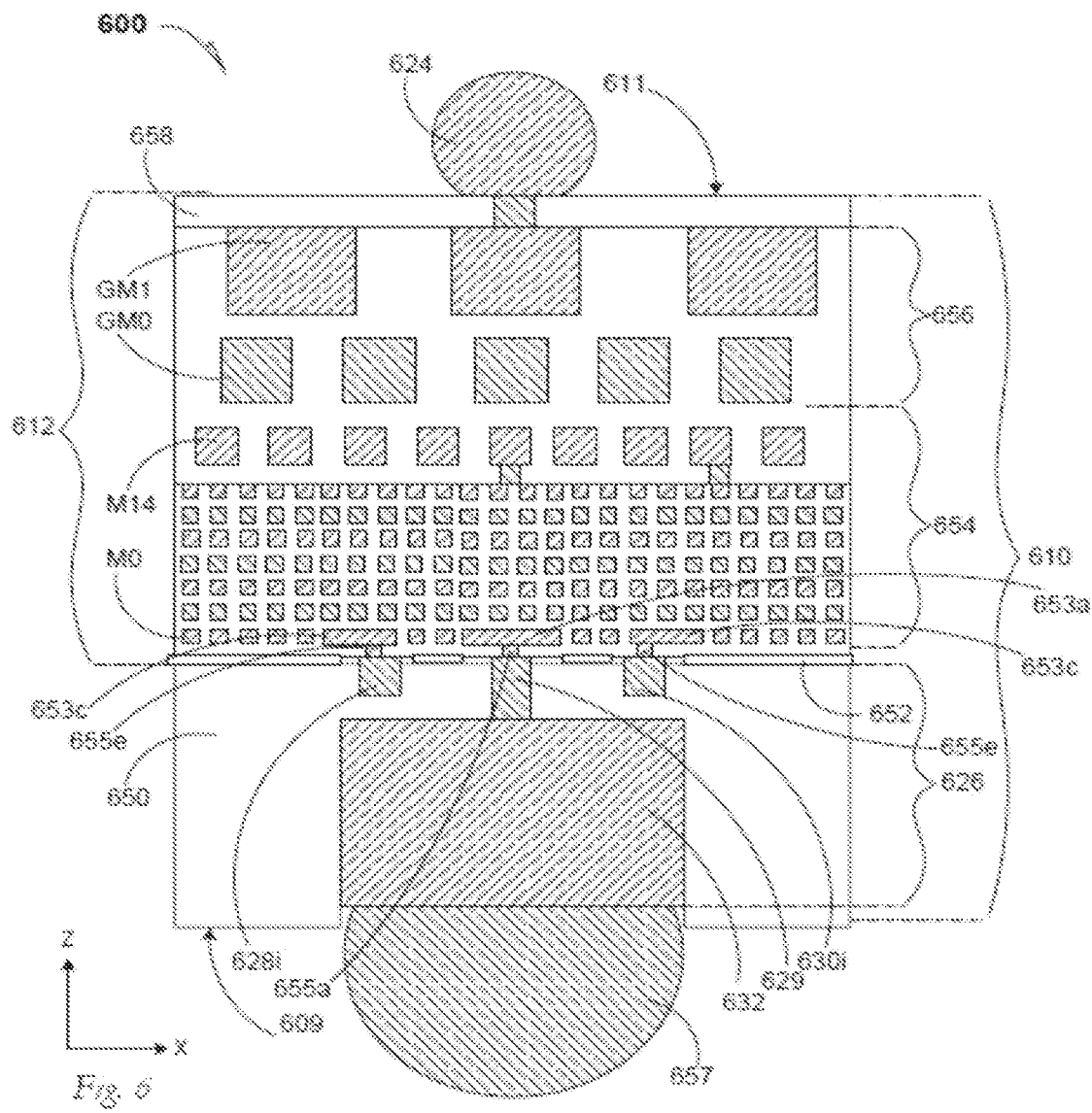
FIG. 6 is a cross-section elevation and detail extraction of a stacked through-silicon as it couples to active areas, metallization and giant metallization for a semiconductive device according to an embodiment.

FIG. 6 is a cross-section elevation and detail extraction of a stacked through-silicon via 600 as it couples to active areas, metallization and giant metallization for a semiconductive device according to an embodiment.

A stacked through-silicon via 626 includes a plurality of stacked TSV first portions 628$i$, 629 and 630$i$, and a stacked TSV second portion 632. Although the two stacked TSV first portions 628$i$ and 630$i$ are depicted in the same plane as the stacked TSV first portion 629, in an embodiment, the stacked TSV first portion 629 contacts a stacked TSV second portion 632, but the two stacked TSV first portions 628$i$ and 630$i$ are isolated from the stacked TSV first portion 629 as well as the stacked TSV second portion 632.

In an embodiment, the isolated stacked TSV first portions 628$i$ and 630$i$ are both isolated from the stacked TSV first portion 629, as well as they are differently coupled. For example, one type is selected from power, ground and signal, and the other type is differently selected from power, ground and signal. In a specific example, the sTSV first portions 628$i$ and 630$i$ are isolated ground stacked through-silicon vias first portions, and the sTSV 629 is a connected signal stacked through-silicon via first portion that is connected to the stacked through-silicon via second portion 632.

In an embodiment, a semiconductive device 610 is similar to the first semiconductive device 110, or to the first semiconductive device 210, or to the first semiconductive device 310, or to the first semiconductive device 410 or to the first semiconductive device 510 depicted respectively in FIGS. 1, 2G, 3, 4 and 5. Details within the first semiconductive device 610 include active semiconductive regions and metallization 612 between a backside surface 609 and an interconnect surface 611. Further details of the active semiconductive devices include bulk semiconductive material 650, an active semiconductive-device layer 652, a first metallization zone 654, including metal-zero (M0) to, e.g. M14 layer 654, and a giant metallization zone 656, including giant metal-zero (GM0) to GM1.

Where the several stacked through-silicon via second portions 628$i$, 629 and 630$i$ penetrate to the metallizations 654, keep-out regions are devoid of the active semiconductive-device layer that abuts the bulk semiconductive material 650.

In an embodiment, the stacked TSV first portions 628$i$ and 630$i$ are isolated ground (Vss) stacked TSVs first portions, and the stacked TSV first portion 629 is a connected signal stacked TSV first portion. In an embodiment, a plurality of stacked TSV first portions e.g. first portions similar to first portion 629 are coupled to a first integrated contact pad 653$a$ through example conductive vias 655$a$. In an embodiment, the isolated ground (Vss) stacked TSVs first portions are coupled to an integrated contact pad 653$c$ through example conductive vias 655$e$, in an embodiment, the stacked TSV first portions 628*i* and 630*i* are isolated power (Vcc) stacked TSVs first portions, and the stacked TSV first portion 629 is a connected signal stacked TSV first portion. Electrical coupling between the backside surface 609 and the interconnect surface 611 is done by a landside bump 657 and an inter-die bump 624, where the inter-die bump 624 emerges from the interconnect surface 611 through an interconnect dielectric layer 658.

In an embodiment, a dedicated small-metallization via similar to the small-metallization via 355*c* depicted in FIG. 3A is provided to contact the landside bump 657 and to penetrate the first metallization zone 654.

Figure 7:
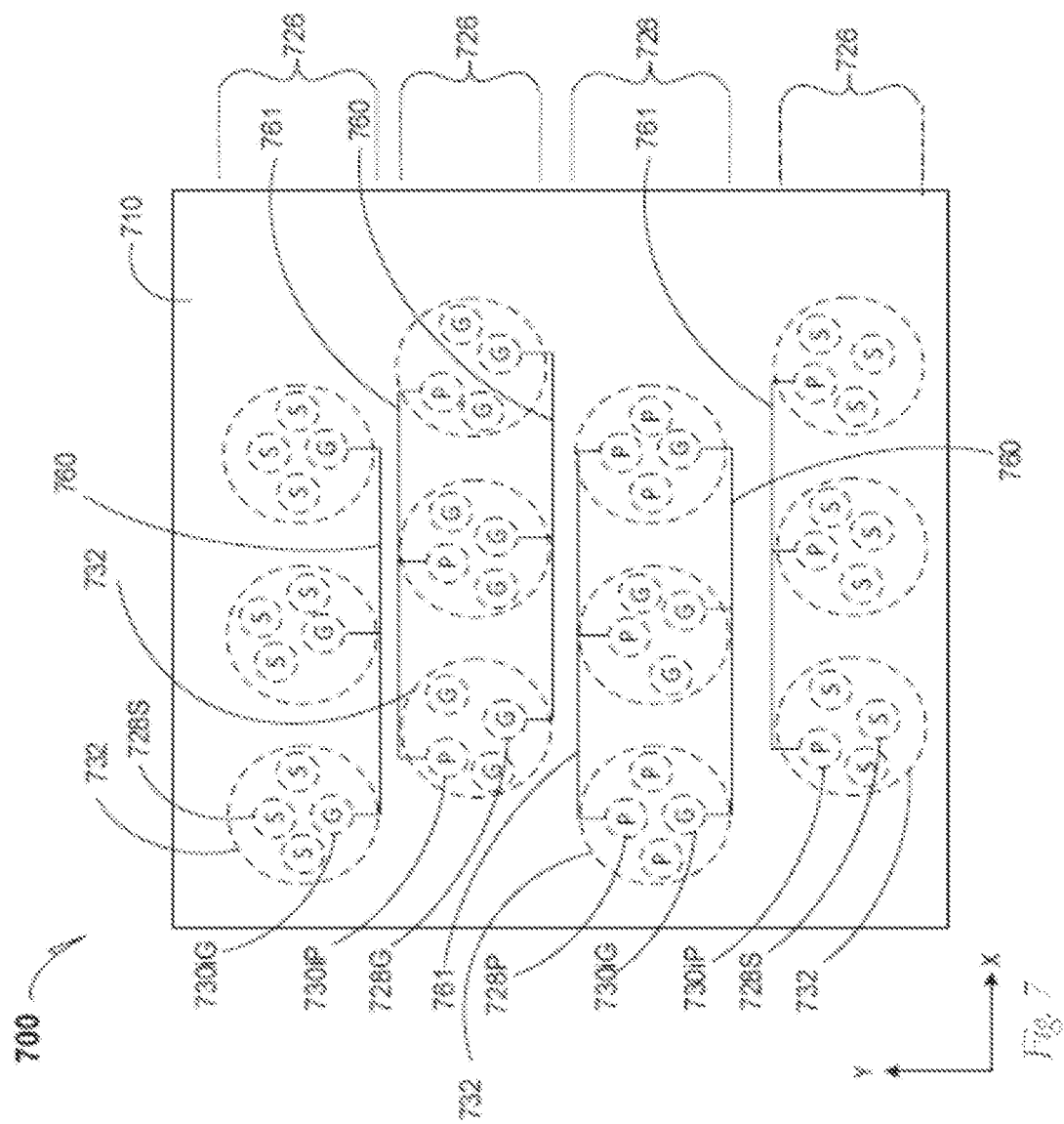
FIG. 7 is a schematic plan that includes several stacked through-silicon vias, including power, ground and signal sTSVs, where adjacent power, ground and signal sTSVs are interleaved, selectively connected or isolated, and selectively clustered according to several embodiments.

FIG. 7 is a schematic plan 700 that includes several stacked through-silicon vias, including power, ground and signal sTSVs, where adjacent power, ground and signal sTSVs are interleaved, selectively connected or isolated, and selectively clustered according to several embodiments. In an embodiment, a first semiconductive device 710 includes several sTSVs 726 that are arranged in tour rows.

At the top row (positive-Y direction), signal and ground stacked through-silicon vias first portions are under the footprint of a stacked through-silicon via second portion 726. The top left stacked through-silicon via second portion 732 has an X-Y footprint that includes a connected signal stacked through-silicon via first portion 728S. This connected signal stacked through-silicon via first portion 728S is analogously seen in FIG. 6 as the stacked through-silicon via first portion 629 that contacts the stacked through-silicon via second portion 632. Referring to FIG. 7, also below the footprint of the stacked through-silicon via, second portion 732 in the top row, is an isolated ground stacked through-silicon via first portion 730*i*G, that is coupled to two more isolated ground stacked through-silicon via first portions 730*i*G (not labeled) by Vss metal routing 760. The isolated ground stacked through-silicon via first portion 730*i*G can be analogously mapped to the isolated stacked TSV first portion 628*i* depicted in FIG. 6 in X-Z coordinates, where the isolated stacked TSV first portion 628*i* is within the X-Y footprint of the stacked TSV second portion 632, but the isolated stacked TSV first portion 628*i* does not contact the stacked signal via second portion 632 in the Z-direction.

Reference is again made to FIG. 7. At the second-from-top row (positive-Y direction), power and ground stacked through-silicon via stacked TSV first portions are under the footprint of a stacked through-silicon via second portion 732. The leftmost stacked through-silicon via second portion 732 has an X-Y footprint that includes a connected ground stacked through-silicon via first portion 728G that is coupled to two more connected ground stacked through-silicon via first portions 728G (not labeled) by Vss metal routing 760. In each instance of the connected ground stacked through-silicon via first portions 728G, each connected ground stacked through-silicon via first portion 728G contacts a stacked through-silicon via second portion 732 (one instance labeled). Also below the footprint of these stacked through-silicon via second portions 732, is an isolated power stacked through-silicon via first portion 730*i*P, that is coupled to two more isolated power stacked through-silicon via first portions by Vcc metal routing 761. The isolated power stacked through-silicon via first portion 730*i*P can analogously mapped to the isolated stacked TSV first portion 628*i* depicted in FIG. 6 in X-Z coordinates, where the isolated stacked TSV first portion 628*i* is within the X-Y footprint of the stacked TSV second portion 632, but the isolated stacked TSV first portion 628*i* does not contact the stacked through-silicon via second portion 632.

Reference is again made to FIG. 7. At the second-from-bottom row (positive-Y direction), connected power and isolated ground stacked through-silicon via first portions are under the footprint of a stacked through-silicon via second portion 732. The leftmost stacked through-silicon via second portion 732 has an X-Y footprint that includes a connected power stacked through-silicon via first portion 728P that is coupled to two more connected power stacked through-silicon via first portions 728P (not labeled) by Vcc metal routing 761. In each instance of the connected power stacked through-silicon via first portions 728P, each connected power stacked through-silicon via first portion 728P contacts a stacked through-silicon via second portion 732 (one instance labeled). Also below the footprint of these stacked through-silicon via second portions 732, is an isolated ground stacked through-silicon via first portion 730*i*G, that is coupled to two more isolated ground stacked through-silicon via first portions 730*i*G by Vss metal routing 760. The isolated ground stacked through-silicon via first portion 730*i*G can analogously be mapped to the isolated stacked TSV first portion 628*i* depicted in FIG. 6 in X-Z coordinates, where the isolated stacked TSV first portion 628*i* is within the X-Y footprint of the stacked TSV second portion 632, but the isolated stacked TSV first portion 628*i* does not contact the stacked through-silicon via second portion 632.

Reference is again made to FIG. 7. At the bottom row (positive-Y direction), isolated power and signal stacked through-silicon via first portions are under the footprint of a stacked through-silicon via second portion 732. The leftmost stacked through-silicon via second portion 732 has an X-Y footprint that includes a signal stacked through-silicon via first portion 728S. Similarly two more occurrences of signal stacked through-silicon via first portions 728S (not labeled) each contact a stacked through-silicon via second portion (not labeled). In each instance of the signal stacked through-silicon via first portions 728S, each signal stacked through-silicon via first portion 728S contacts a stacked through-silicon via second portion 732 (one instance labeled). Also below the footprint of these stacked through-silicon via second portions 732, is an isolated power stacked through-silicon via first portion 730*i*P, that is coupled to two more isolated power stacked through-silicon via first portions 730*i*P by Vcc metal routing 761. The isolated power stacked through-silicon via first portion 730*i*P can analogously be mapped to the isolated stacked TSV first portion 628*i* depicted in FIG. 6 in X-Z coordinates, where the isolated stacked TSV first portion 628*i* is within the X-Y footprint of the stacked TSV second portion 632, but the isolated stacked TSV first portion 628*i* does not contact the stacked through-silicon via second portion 632.

In an embodiment, the Vss metal routing 760 and the Vcc metal routing 761 reside within the first metallization zone (e.g. item 654 in FIG. 6) such as M14. In an embodiment, the Vss metal routing 760 and the Vcc metal routing 761 reside within the giant metallization zone (e.g. item 656 in FIG. 6) such as giant metal-zero (GM0). In an embodiment, the Vss metal routing 760 and the Vcc metal routing 761 extend across the first metallization zone (e.g. item 654 in FIG. 6) and the giant metallization zone (e.g. item 656 in FIG. 6) in the form of metal layer stack.

Figure 8:
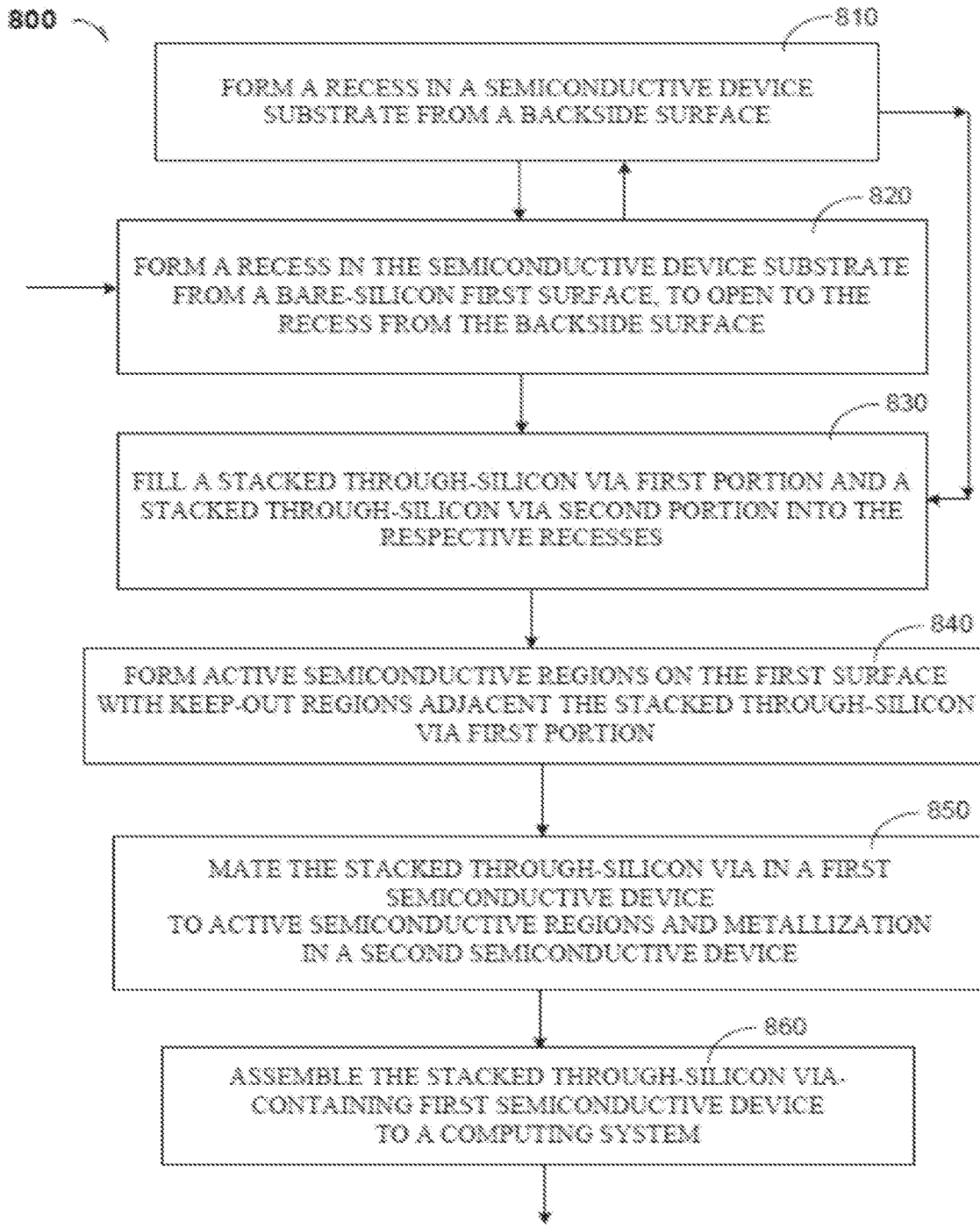
FIG. 8 is a process flow diagram according to several embodiments.

FIG. 8 is a process flow diagram 800 according to several embodiments.

At 810, the process includes forming a recess in a semiconductive device substrate. In a non-limiting example embodiment, a recess 240 is formed through the backside surface 209 of the semiconductive wafer 210.

At 820, the process includes forming at least one recess in the semiconductive structure that communicates and opens to the recess that was formed through the backside surface. In a non-limiting example embodiment, the stacked through-silicon via 203 has been processed by opening at least one recess 242 and 244 in the semiconductive wafer 210 from the bare-silicon first surface 241, and the at least one recess 242 and 244 open and connect to the recess 240.

In an embodiment, the process of 810 is second conducted after the process 820.

At 830, the process includes filling stacked through-silicon via first and second portions into the respective recesses. In an embodiment, a conductive metal layer e.g. copper or aluminum layer is deposited into the respective recesses 240, 242 and 244, for example an electroplating process. In an embodiment, the stacked through-silicon via first and second portions include one of copper, tungsten, aluminum, silver, gold, tin-silver or tin-silver copper composites. In an embodiment, the stacked through-silicon via first portion comprises different electrically conductive material. For example, the stacked through-silicon via first portion comprises tungsten metal, the stacked through-silicon via second portion comprises copper metal.

At 840, the process includes forming active devices on the bare-silicon first surface with keep-out regions not being processed to form active devices. In a non-limiting example embodiment, the active semiconductive regions and metallization 212 are formed on the bare-silicon first surface 241.

At 850, the process includes mating a first semiconductive device to a second semiconductive device by contacting the stacked through-silicon via in the first semiconductive device to active semiconductive regions and metallization in the second semiconductive device.

At 860, the process includes assembling the first semiconductive device to a computing system.

Figure 9:
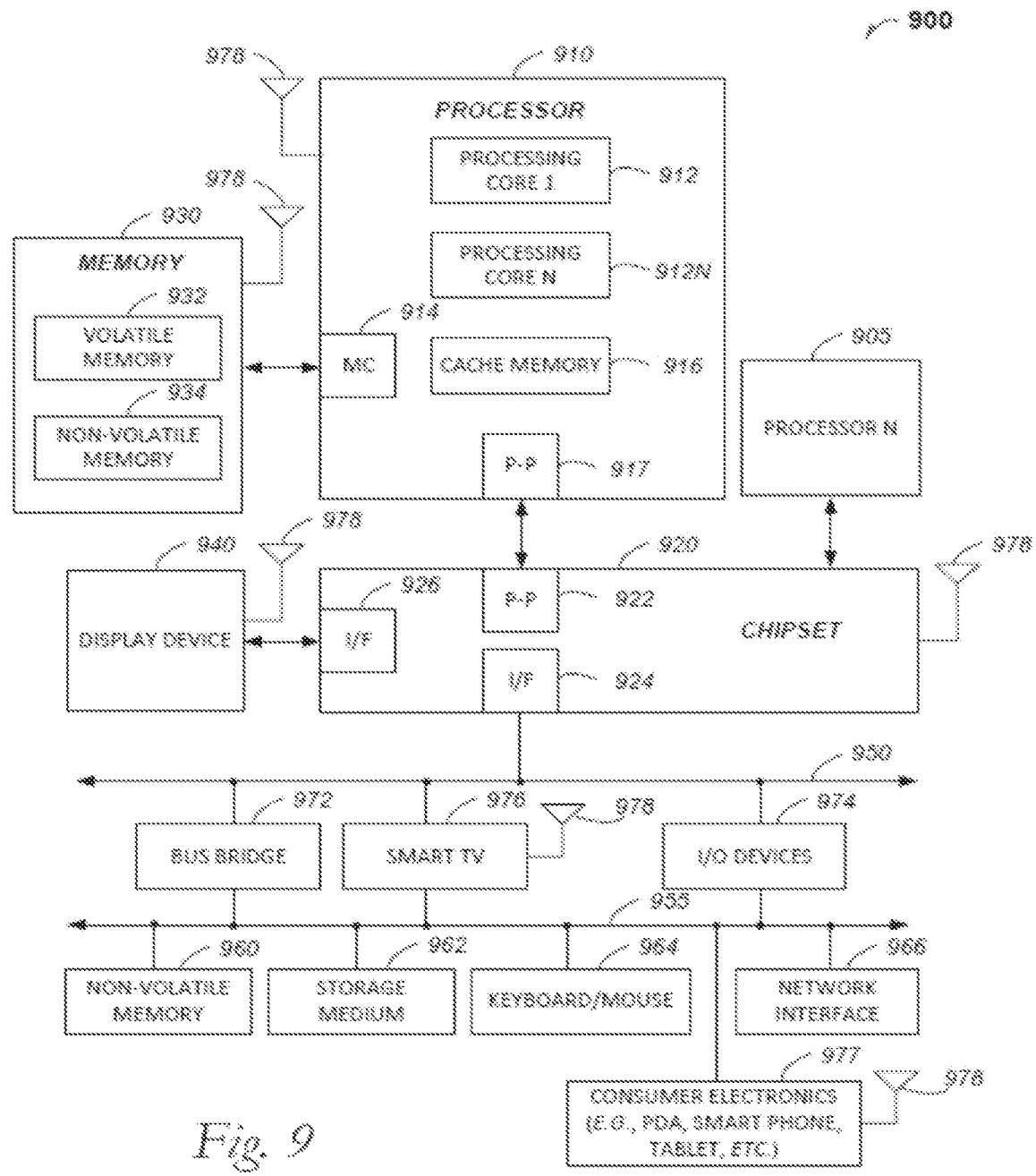
FIG. 9 is included to show an example of a higher-level device application for the disclosed embodiments.

FIG. 9 is included to show an example of a higher-level device application for the disclosed embodiments. The stacked through-silicon via-containing semiconductive device embodiments may be found in several parts of a computing system. In an embodiment, the stacked through-silicon via-containing semiconductive device embodiments can be part of a communications apparatus such as is affixed to a cellular communications tower. In an embodiment, a computing system 900 includes, but is not limited to, a desktop computer. In an embodiment, a computing system 900 includes, but is not limited to a laptop computer. In an embodiment, a computing system 900 includes, but is not limited to a tablet. In an embodiment, a computing system 900 includes, but is not limited to a notebook computer. In an embodiment, a computing system 900 includes, but is not limited to a personal digital assistant (PDA). In an embodiment, a computing system 900 includes, but is not limited to a server. In an embodiment, a computing system 900 includes, hut is not limited to a workstation. In an embodiment, a computing system 900 includes, but is not limited to a cellular telephone. In an embodiment, a computing system 900 includes, but is not limited to a mobile computing device. In an embodiment, a computing system 900 includes, but is not limited to a smart phone. In an embodiment, a system 900 includes, but is not limited to an internet appliance. Other types of computing devices may be configured with the microelectronic device that includes stacked through-silicon via-containing semiconductive device embodiments.

In an embodiment, the processor 910 has one or more processing cores 912 and 912N, where 912N represents the Nth processor core inside processor 910 where N is a positive integer. In an embodiment, the electronic device system 900 using a stacked through-silicon via-containing semiconductive device embodiment that includes multiple processors including 910 and 905, where the processor 905 has logic similar or identical to the logic of the processor 910. In an embodiment, the processing core 912 includes, but is not limited to, pre-fetch logic to fetch instructions, decode logic to decode the instructions, execution logic to execute instructions and the like. In an embodiment, the processor 910 has a cache memory 916 to cache at least one of instructions and data for the stacked through-silicon via-containing semiconductive device embodiment in the system 900. The cache memory 916 may be organized into a hierarchal structure including one or more levels of cache memory.

In an embodiment, the processor 910 includes a memory controller 914, which is operable to perform functions that enable the processor 910 to access and communicate with memory 930 that includes at least one of a volatile memory 932 and a non-volatile memory 934. In an embodiment, the processor 910 is coupled with memory 930 and chipset 920. In an embodiment, the chipset 920 is part of a stacked through-silicon via-containing semiconductive device embodiment depicted in any of FIG. 1, 2A through 2G, 3, 3A, 4, 5, 6 or 7. The processor 910 may also be coupled to a wireless antenna 978 to communicate with any device configured to at least one of transmit and receive wireless signals. In an embodiment, the wireless antenna interface 978 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 934 includes, but is not limited to, flash memory, phase change memory (PCM), read-only memory (ROM), electrically erasable programmable read-only memory (EEPROM), or any other type of non-volatile memory device.

The memory 930 stores information and instructions to be executed by the processor 910. In an embodiment, the memory 930 may also store temporary variables or other intermediate information while the processor 910 is executing instructions. In the illustrated embodiment, the chipset 920 connects with processor 910 via Point-to-Point (PtP or P-P) interfaces 917 and 922. Either of these PtP embodiments may be achieved using a stacked through-silicon via in a semiconductive device embodiment as set forth in this disclosure. The chipset 920 enables the processor 910 to connect to other elements in a stacked through-silicon via in a semiconductive device embodiment in a system 900. In an embodiment, interfaces 917 and 922 operate in accordance with a PtP communication protocol such as the Intel® QuickPath Interconnect (QPI) or the like. In other embodiments, a different interconnect may be used.

In an embodiment, the chipset 920 is operable to communicate with the processor 910, 905N, the display device 940, and other devices 972, 976, 974, 960, 962, 964, 966, 977, etc. The chipset 920 may also be coupled to a wireless antenna 978 to communicate with any device configured to at least do one of transmit and receive wireless signals.

The chipset 920 connects to the display device 940 via the interface 926. The display 940 may be, for example, a liquid crystal display (LCD), a plasma display, cathode ray tube (CRT) display, or any other form of visual display device. In an embodiment, the processor 910 and the chipset 920 are merged into a stacked through-silicon via-containing semiconductive device embodiment in a system. Additionally, the chipset 920 connects to one or more buses 950 and 955 that interconnect various elements 974, 960, 962, 964, and 966. Buses 950 and 955 may be interconnected together via a bus bridge 972 such as at least one stacked through-silicon via-containing semiconductive device embodiment. In an embodiment, the chipset 920, via interface 924, couples with a non-volatile memory 960, a mass storage device(s) 962, a keyboard/mouse 964, a network interface 966, smart TV 976, and the consumer electronics 977, etc.

In an embodiment, the mass storage device 962 includes, but is not limited to, a solid-drive, a hard disk drive, a universal serial bus flash memory drive, or any other form of computer data storage medium. In one embodiment, the network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 9 are depicted as separate blocks within the stacked through-silicon via-containing semiconductive device embodiments in a computing system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into the processor core 912.

To illustrate the stacked through-silicon via-containing semiconductive device embodiments and methods disclosed herein, a non-limiting list of examples is provided herein:

Example 1 is a semiconductor device, comprising: a semiconductive substrate including a first surface and a backside surface opposite the first surface; a stacked through-silicon via in the semiconductive substrate, including a stacked through-silicon via first portion that communicates to the first surface and a stacked through-silicon via second portion that communicates to the backside surface, wherein the stacked through-silicon via first portion contacts the stacked through-silicon via second portion, and wherein the stacked through-silicon via first portion has a smaller lateral dimension than the stacked through-silicon via second portion; at least one active semiconductive region derived from the first surface; and a keep-out region on the first surface that surrounds and is adjacent the stacked through-silicon via first portion.

In Example 2, the subject matter of Example 1 optionally includes wherein the stacked through-silicon via first portion is one of a plurality of stacked through-silicon via first portions.

In Example 3, the subject matter of any one or more of Examples 1-2 optionally include wherein the stacked through-silicon via includes a stacked through-silicon via third portion between the stacked through-silicon via first and second portions, and wherein the stacked through-silicon via third portion has a lateral dimension larger than the stacked through-silicon via first portion and a lateral dimension smaller than the stacked through-silicon via second portion.

In Example 4, the subject matter of any one or more of Examples 1-3 optionally include wherein the stacked through-silicon via first portion is one of a plurality of stacked through-silicon via first portions including three stacked through-silicon via first portions.

In Example 5, the subject matter of any one or more of Examples 1-4 optionally include wherein the at least one active semiconductive region is part of active semiconductive regions and metallization including an interconnect surface.

In Example 6, the subject matter of any one or more of Examples 1-5 optionally include wherein the semiconductive device is a first semiconductive device, wherein the at least one active semiconductive region is part of active semiconductive regions and metallization including an interconnect surface, further including: a subsequent semiconductive device mated at the interconnect surface, wherein the stacked through-silicon via is coupled to the subsequent semiconductive device at the interconnect surface.

In Example 7, the subject matter of any one or more of Examples 1-6 optionally include wherein the semiconductive device is a first semiconductive device, wherein the at least one active semiconductive region is part of active semiconductive regions and metallization including an interconnect surface, further including: a subsequent semiconductive device mated at the interconnect surface, wherein the stacked through-silicon via is coupled to the subsequent semiconductive device at the interconnect surface; and a semiconductor package substrate coupled to the first semiconductive device at the back surface.

In Example 8, the subject matter of any one or more of Examples 1-7 optionally include wherein the at least one active semiconductive region is part of active semiconductive regions and metallization including an interconnect surface, further including a small-metallization via in the metallization that contacts the stacked through-silicon via first portion, and that penetrates the metallization from a small metallization, metal-zero (M0) to at least to a small metallization Mn−1.

In Example 9, the subject matter of any one or more of Examples 1-8 optionally include wherein the stacked through-silicon via is a first stacked through-silicon via in the semiconductive substrate, further including a subsequent stacked through-silicon via that communicates from the backside surface to the first surface.

In Example 10, the subject matter of any one or more of Examples 1-9 optionally include wherein the at least one active semiconductive region including a portion of device layer is adjacent the plurality of stacked through-silicon via first portions within a lateral footprint of the stacked through-silicon via second portion.

In Example 11, the subject matter of any one or more of Examples 1-10 optionally include wherein the stacked through-silicon via is a first stacked through-silicon via in the semiconductive substrate, further including: a subsequent stacked through-silicon via that communicates from the backside surface to the first surface; and a third stacked through-silicon via that communicates from the backside surface to the first surface, wherein the first and third stacked through-silicon vias straddle the subsequent stacked through-silicon via, wherein the first and third stacked through-silicon vias are coupled by silicon metal routing, and where the first and third stacked through-silicon vias are selected from the group consisting of power, ground and signal stacked through-silicon vias, and wherein the subsequent stacked through-silicon via is selected from another of the power, ground and signal through-silicon vias.

In Example 12, the subject matter of any one or more of Examples 1-11 optionally include wherein the stacked through-silicon via is a first stacked through-silicon via in the semiconductive substrate, further including: a subsequent stacked through-silicon via that communicates from the backside surface to the first surface; and a third stacked through-silicon via that communicates from the backside surface to the first surface, wherein the first and third stacked through-silicon vias straddle the subsequent stacked through-silicon via, wherein the first and third stacked through-silicon vias are coupled by silicon metal routing, and where the first and third stacked through-silicon vias are selected from the group consisting of power, ground and signal stacked through-silicon vias, and wherein the subsequent stacked through-silicon via is differently selected from the power, ground and signal through-silicon vias.

In Example 13, the subject matter of Example 12 optionally includes wherein the first and third stacked through-silicon vias are coupled to ground (Vss) and wherein the subsequent stacked through-silicon via is coupled to signal.

In Example 14, the subject matter of any one or more of Examples 12-13 optionally include wherein the first, subsequent and third stacked through-silicon vias are in a first row, further including in a subsequent row adjacent to the first row: a first stacked through-silicon via that communicates from the backside surface to the first surface; a subsequent stacked through-silicon via that communicates from the backside surface to the first surface; and a third stacked through-silicon via that communicates from the backside surface to the first surface, wherein the first and third stacked through-silicon vias straddle the subsequent stacked through-silicon via, wherein the first and third stacked through-silicon vias are coupled by silicon metal routing, and wherein the first and third stacked through-silicon vias are selected from the group consisting of power, ground and signal stacked through-silicon vias that is different from the first and third stacked through-silicon vias in the first row, and wherein the subsequent stacked through-silicon via is selected from another of the power, ground and signal through-silicon vias.

In Example 15, the subject matter of any one or more of Examples 12-14 optionally include wherein the silicon metal routing is in a first metallization zone.

In Example 16, the subject matter of any one or more of Examples 12-15 optionally include wherein the silicon metal routing extends across a first metallization zone and a giant metallization zone.

In Example 17, the subject matter of any one or more of Examples 14-16 optionally include wherein in the first row, the first and third stacked through-silicon vias are coupled to ground by silicon metal routing and wherein the subsequent stacked through-silicon via is coupled to signal; wherein in the subsequent row, the first and third stacked through-silicon vias are coupled to power by silicon metal routing and wherein the subsequent stacked through-silicon via is coupled to signal.

In Example 18, the subject matter of any one or more of Examples 14-17 optionally include a third row adjacent the subsequent row, the third row including: a first stacked through-silicon via that communicates from the backside surface to the first surface; a subsequent stacked through-silicon via that communicates from the backside surface to the first surface; and a third stacked through-silicon via that communicates from the backside surface to the first surface, wherein the first and third stacked through-silicon vias straddle the subsequent stacked through-silicon via, wherein the first and third stacked through-silicon vias are coupled by silicon metal routing, and wherein the first and third stacked through-silicon vias are selected from the group consisting of power, ground and signal stacked through-silicon vias that is the same selection of the first and third stacked through-silicon vias in the first row, and wherein the subsequent stacked through-silicon via is selected from another of the power, ground and signal through-silicon vias.

In Example 19, the subject matter of any one or more of Examples 1-18 optionally include wherein the stacked through-silicon via is a first stacked through-silicon via in the semiconductive substrate, further including: a subsequent stacked through-silicon via that communicates from the backside surface to the first surface; a third stacked through-silicon via that communicates from the backside surface to the first surface; and a fourth stacked through-silicon via that communicates from the backside surface to the first surface, wherein the first and third stacked through-silicon vias straddle the subsequent stacked through-silicon via, wherein the subsequent and fourth stacked through-silicon vias straddle the third stacked through-silicon via, wherein the first and third stacked through-silicon vias are coupled by silicon metal routing, wherein the subsequent and fourth stacked through-silicon vias are coupled by silicon metal routing, wherein the first and third stacked through-silicon vias are selected from the group consisting of power, ground and signal stacked through-silicon vias, and wherein the subsequent and fourth stacked through-silicon vias are differently selected from the power, ground and signal through-silicon vias.

In Example 20, the subject matter of any one or more of Examples 18-19 optionally include wherein the first and third stacked through-silicon vias are connected to ground by silicon metal routing and wherein the subsequent and fourth stacked through-silicon vias are connected to power by silicon metal routing.

In Example 21, the subject matter of any one or more of Examples 19-20 optionally include wherein the first, subsequent, third and fourth stacked through-silicon vias are in a first row, further including in a subsequent row adjacent to the first row: a first stacked through-silicon via that communicates from the backside surface to the first surface; a subsequent stacked through-silicon via that communicates from the backside surface to the first surface; and a third stacked through-silicon via that communicates from the backside surface to the first surface; and a fourth stacked through-silicon via that communicates from the backside surface to the first surface, wherein the first and third stacked through-silicon vias straddle the subsequent stacked through-silicon via, wherein the subsequent and fourth stacked through-silicon vias straddle the third stacked through-silicon via, wherein the first, subsequent, third and fourth stacked through-silicon vias are coupled to signal.

In Example 22, the subject matter of Example 21 optionally includes a third row adjacent the subsequent row, the third row including: a first stacked through-silicon via that communicates from the backside surface to the first surface; a subsequent stacked through-silicon via that communicates from the backside surface to the first surface; a third stacked through-silicon via that communicates from the backside surface to the first surface; and a fourth stacked through-silicon via that communicates from the backside surface to the first surface, wherein the first and third stacked through-silicon vias straddle the subsequent stacked through-silicon via, wherein the subsequent and fourth stacked through-silicon vias straddle the third stacked through-silicon via, wherein the first and third stacked through-silicon vias are coupled by silicon metal routing, wherein the subsequent and fourth stacked through-silicon vias are coupled by silicon metal routing, wherein the first and third stacked through-silicon vias are selected from the group consisting of power, ground and signal stacked through-silicon vias, and wherein the subsequent and fourth stacked through-silicon vias are differently selected from the power, ground and signal through-silicon vias.

In Example 23, the subject matter of Example 22 optionally includes wherein for the first and third rows, each first and subsequent stacked through-silicon vias is coupled to ground, and each second and fourth stacked through-silicon vias is coupled to power.

Example 24 is a semiconductor device, comprising: a semiconductive substrate including a first surface and a backside surface opposite the first surface; a stacked through-silicon via in the semiconductive substrate, including a stacked through-silicon via first portion that communicates to the first surface and a stacked through-silicon via second portion that communicates to the backside surface, wherein the stacked through-silicon via first portion contacts the stacked through-silicon via second portion, and wherein the stacked through-silicon via first portion has a smaller lateral dimension than the stacked through-silicon via second portion; an isolated stacked through-silicon via first portion that communicates to the first surface, wherein the isolated stacked through-silicon via first portion is within the lateral dimension of the stacked through-silicon via second portion and is isolated from the stacked through-silicon via first portion and the stacked through silicon-via second portion, wherein the stacked through-silicon via is selected from the group consisting of power, ground and signal stacked through-silicon vias, and wherein the isolated stacked through-silicon via first portion is selected from the group consisting of power and ground isolated stacked through-silicon via first portion that is different from the stacked through-silicon via; at least one active semiconductive region derived from the first surface; and a keep-out region on the first surface that surrounds and is adjacent the stacked through-silicon via first portion.

In Example 25, the subject matter of Example 24 optionally includes wherein the stacked through-silicon via is a first stacked through-silicon, further including a subsequent stacked through-silicon via, including: a stacked through-silicon via first portion that communicates to the first surface and a stacked through-silicon via second portion that communicates to the backside surface, wherein the stacked through-silicon via first portion contacts the stacked through-silicon via second portion, and wherein the stacked through-silicon via first portion has a smaller lateral dimension than the stacked through-silicon via second portion; an isolated stacked through-silicon via first portion that communicates to the first surface, wherein the isolated stacked through-silicon via first portion is within the lateral dimension of the stacked through-silicon via second portion and is isolated from the stacked through-silicon via first portion and the stacked through silicon-via second portion, wherein the stacked through-silicon via is selected from the group consisting of power, ground and signal stacked through-silicon vias, and wherein the isolated stacked through-silicon via first portion is selected from the group consisting of power and ground isolated stacked through-silicon via first portion that is different from the stacked through-silicon via; and wherein the first stacked through-silicon via and the subsequent stacked through-silicon via are coupled by silicon metal routing.

Example 26 is a process of assembling a stacked through-silicon via device, comprising: forming a recess in a semiconductive device substrate from a backside surface; forming a recess in the semiconductive device substrate from a first surface to open the recess from the backside surface; form a stacked through-silicon via first portion in the recess at the first surface and a stacked through-silicon via second portion in the recess at the backside surface to contact the stacked through-silicon via first portion; and form active semiconductive regions on the first surface with keep-out regions adjacent the stacked through-silicon via first portion to achieve a semiconductive device.

In Example 27, the subject matter of Example 26 optionally includes wherein the semiconductive device is a first semiconductive device further including: mating a second semiconductive device to the first semiconductive device by coupling the stacked through-silicon via to active regions and metallization in the second semiconductive device.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor device, comprising:
    a semiconductive substrate including a first surface and a backside surface opposite the first surface;
    a stacked through-silicon via, including a plurality of stacked through-silicon via first portions that communicate to the first surface, and a stacked through-silicon via second portion that communicates to the backside surface, wherein the stacked through-silicon via first portions contact the stacked through-silicon via second portion, and wherein the stacked through-silicon via first portions have a smaller lateral dimension than the stacked through-silicon via second portion, and wherein individual through-silicon via first portions in the plurality of stacked through-silicon via first portions couple to at least two different structures in a metallization coupled to the first surface, wherein the metallization includes an interconnect surface;
    a subsequent semiconductive unit mated at the interconnect surface, wherein the stacked through-silicon via is coupled to the subsequent semiconductive unit at the interconnect surface;
    at least one active semiconductive region derived from the first surface; and
    a keep-out region on the first surface that surrounds and is adjacent the stacked through-silicon via first portions.

2. The semiconductive device of claim 1, wherein the stacked through-silicon via includes a stacked through-silicon via third portion between the stacked through-silicon via first and second portions, and wherein the stacked through-silicon via third portion has a lateral dimension larger than the stacked through-silicon via first portions and a lateral dimension smaller than the stacked through-silicon via second portion.

3. The semiconductive device of claim 1, further including a semiconductor package substrate coupled to the semiconductive device at the backside surface.

4. The semiconductive device of claim 1, further including a small-metallization via in the metallization that contacts the stacked through-silicon via first portion, and that penetrates the metallization from a small metallization, metal-zero (M0) to at least to a small metallization Mn−1.

5. The semiconductive device of claim 1, wherein the stacked through-silicon via is a first stacked through-silicon via in the semiconductive substrate, further including a subsequent stacked through-silicon via that communicates from the backside surface to the first surface.

6. The semiconductive device of claim 1, wherein the plurality of stacked through-silicon via first portions are within a lateral footprint of the stacked through-silicon via second portion.

7. The semiconductive device of claim 1, wherein the stacked through-silicon via is a first stacked through-silicon via in the semiconductive substrate, further including:
    a second stacked through-silicon via that communicates from the backside surface to the first surface; and
    a third stacked through-silicon via that communicates from the backside surface to the first surface, wherein the first and third stacked through-silicon vias straddle the second stacked through-silicon via, wherein the first and third stacked through-silicon vias are coupled by silicon metal routing, and where the first and third stacked through-silicon vias are selected from the group consisting of power, ground and signal stacked through-silicon vias, and wherein the second stacked through-silicon via is differently selected from the power, ground and signal through-silicon vias.

8. The semiconductive device of claim 7, wherein the first and third stacked through-silicon vias are coupled to ground (Vss) and wherein the second stacked through-silicon via is coupled to signal.

9. The semiconductive device of claim 7, wherein the first, second and third stacked through-silicon vias are in a first row, further including in a second row adjacent to the first row, the second row including:
    a fourth stacked through-silicon via that communicates from the backside surface to the first surface;
    a fifth stacked through-silicon via that communicates from the backside surface to the first surface; and
    a sixth stacked through-silicon via that communicates from the backside surface to the first surface, wherein the fourth and sixth stacked through-silicon vias straddle the fifth stacked through-silicon via, wherein the fourth and sixth stacked through-silicon vias are coupled by silicon metal routing, and wherein the fourth and sixth stacked through-silicon vias are selected from the group consisting of power, ground and signal stacked through-silicon vias that is different from the first and third stacked through-silicon vias in the first row, and wherein the fifth stacked through-silicon via is selected from another of the power, ground and signal through-silicon vias.

10. The semi conductive device of claim 9:
    wherein in the first row, the first and third stacked through-silicon vias are coupled to ground by silicon metal routing and wherein the second stacked through-silicon via is coupled to signal;
    wherein in the second row, the fourth and sixth stacked through-silicon vias are coupled to power by silicon metal routing and wherein the fifth stacked through-silicon via is coupled to signal.

11. The semiconductive device of claim 9, further including a third row adjacent the second row, the third row including:
a seventh stacked through-silicon via that communicates from the backside surface to the first surface;
an eighth stacked through-silicon via that communicates from backside surface to the first surface; and
a ninth stacked through-silicon via that communicates from the backside surface to the first surface, wherein the seventh and ninth stacked through-silicon vias straddle the eighth stacked through-silicon via, wherein the seventh and ninth stacked through-silicon vias are coupled by silicon metal routing, and wherein the seventh and ninth stacked through-silicon vias are selected from the group consisting of power, ground and signal stacked through-silicon vias that is the same selection of the first and third stacked through-silicon vias in the first row, and wherein the eighth stacked through-silicon via is selected from another of the power, ground and signal through-silicon vias.

12. The semiconductive device of claim 11, wherein the first and third stacked through-silicon vias are connected to ground by a silicon metal routing and wherein the second and fourth stacked through-silicon vias are connected to power by a different silicon metal routing.

13. The semiconductive device of claim 7, wherein the silicon metal routing is in a first metallization zone.

14. The semiconductive device of claim 7, wherein the silicon metal routing extends across a first metallization zone and a giant metallization zone.

15. The semiconductive device of claim 1, wherein the stacked through-silicon via is a first stacked through-silicon via in the semiconductive substrate, further including:
a second stacked through-silicon via that communicates from the backside surface to the first surface;
a third stacked through-silicon via that communicates from the backside surface to the first surface; and
a fourth stacked through-silicon via that communicates from the backside surface to the first surface, wherein the first and third stacked through-silicon vias straddle the second stacked through-silicon via, wherein the second and fourth stacked through-silicon vias straddle the third stacked through-silicon via, wherein the first and third stacked through-silicon vias are coupled by silicon metal routing, wherein the second and fourth stacked through-silicon vias are coupled by a different silicon metal routing, wherein the first and third stacked through-silicon vias are selected from the group consisting of power, ground and signal stacked through-silicon vias, and wherein the second and fourth stacked through-silicon vias are differently selected from the power, ground and signal through-silicon vias.

16. The semiconductive device of claim 15, wherein the first, second, third and fourth stacked through-silicon vias are in a first row, further including in a second row adjacent to the first row, the second row including:
a fifth stacked through-silicon via that communicates from the backside surface to the first surface;
a sixth stacked through-silicon via that communicates from the backside surface to the first surface;
a seventh stacked through-silicon via that communicates from the backside surface to the first surface; and
an eighth stacked through-silicon via that communicates from the backside surface to the first surface, wherein the fifth and seventh stacked through-silicon vias straddle the sixth stacked through-silicon via, wherein the sixth and eighth stacked through-silicon vias straddle the seventh stacked through-silicon via, wherein the fifth, sixth, seventh and eighth stacked through-silicon vias are coupled to signal.

17. The semiconductive device of claim 16, further including a third row adjacent the second row, the third row including:
a ninth stacked through-silicon via that communicates from the backside surface to the first surface;
a tenth stacked through-silicon via that communicates from the backside surface to the first surface;
an eleventh stacked through-silicon via that communicates from the backside surface to the first surface; and
a twelfth stacked through-silicon via that communicates from the backside surface to the first surface, wherein the ninth and eleventh stacked through-silicon vias straddle the tenth stacked through-silicon via, wherein the tenth and twelfth stacked through-silicon vias straddle the eleventh stacked through-silicon via, wherein the ninth and eleventh stacked through-silicon vias are coupled by silicon metal routing, wherein the tenth and twelfth stacked through-silicon vias are coupled by a different silicon metal routing, wherein the ninth and eleventh stacked through-silicon vias are selected from the group consisting of power, ground and signal stacked through-silicon vias, and wherein the tenth and twelfth stacked through-silicon vias are differently selected from the power, ground and signal through-silicon vias.

18. The semiconductive device of claim 17, wherein for the first and third rows, the first, third, fifth, seventh, and ninth stacked through-silicon vias are coupled to ground, and the second, fourth, sixth, eighth, and tenth stacked through-silicon vias are coupled to power.

* * * * *